United States Patent
Coburn et al.

(10) Patent No.: US 8,116,090 B2
(45) Date of Patent: Feb. 14, 2012

(54) LOW TEMPERATURE CO-FIRED CERAMIC (LTCC) TRANSMIT/RECEIVE (T/R) ASSEMBLY UTILIZING BALL GRID ARRAY (BGA) TECHNOLOGY

(75) Inventors: Blair Coburn, Milford, NH (US); Candice Brittain, Nashua, NH (US); Peter Wallace, Newfields, NH (US); Thomas O Perkins, III, Bedford, NH (US); Michael R Ehlert, Irvine, CA (US); Ronald H Schmidt, Middleboro, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 425 days.

(21) Appl. No.: 12/420,885

(22) Filed: Apr. 9, 2009

(65) Prior Publication Data

US 2010/0259913 A1    Oct. 14, 2010

(51) Int. Cl.
*H05K 1/18* (2006.01)
*H05K 7/00* (2006.01)
*H05K 1/16* (2006.01)

(52) U.S. Cl. ....... 361/761; 361/760; 361/762; 361/763; 361/764; 174/255; 174/260; 174/262

(58) Field of Classification Search .............. None
See application file for complete search history.

(56) References Cited

U.S. PATENT DOCUMENTS

| | | | | |
|---|---|---|---|---|
| 5,712,767 A * | 1/1998 | Koizumi | | 361/761 |
| 5,768,109 A * | 6/1998 | Gulick et al. | | 361/794 |
| 6,333,856 B1 * | 12/2001 | Harju | | 361/761 |
| 7,045,440 B2 * | 5/2006 | Huff et al. | | 438/456 |
| 7,102,896 B2 * | 9/2006 | Ajioka et al. | | 361/816 |
| 7,294,791 B2 * | 11/2007 | Danoski et al. | | 174/261 |
| 7,535,094 B2 * | 5/2009 | Tornqvist et al. | | 257/700 |
| 7,564,699 B2 * | 7/2009 | Koizumi et al. | | 361/818 |
| 7,808,798 B2 * | 10/2010 | Cotte et al. | | 361/763 |
| 2003/0150641 A1 * | 8/2003 | Kinayman et al. | | 174/255 |

* cited by examiner

*Primary Examiner* — Boris Chervinsky
(74) *Attorney, Agent, or Firm* — Maine, Cernota & Rardin; Andrew P. Cernota

(57) ABSTRACT

A system is provided for the integration of microwave components in a low temperature co-fired ceramic, the system includes a low temperature co-fired ceramic body having a top surface, into which is disposed a plurality of cavities; a plurality of microwave devices, each device being disposed within a cavity such that the cavities provide radio isolation to the devices; and a coaxial connection disposed within the body configured to connect the devices to external components the coaxial components comprising vias disposed within the co-fired ceramic body.

11 Claims, 5 Drawing Sheets

LOW TEMPERATURE CO-FIRED CERAMIC (LTCC) TRANSMIT/RECEIVE (T/R) ASSEMBLY UTILIZING BALL GRID ARRAY (BGA) TECHNOLOGY

STATEMENT OF GOVERNMENT INTEREST

Portions of the present invention were made with United States Government support under Contract Number W15P7T-05-C-P627 awarded by U.S. Department of the Army, CECOM. The United States Government has certain rights in this invention.

FIELD OF THE INVENTION

The invention relates to integrated transmission and reception assemblies, and more particularly, to a Low temperature Co-fired Ceramic Transmission and Reception assembly utilizing ball grid array connections.

BACKGROUND OF THE INVENTION

Traditional methods for assembly of high frequency devices include Hermetic MIC Module, Stripline Assembly, Waveguide Assembly. These methods utilize conventional methods for assembling such devices and require extensive and expensive hermetic packaging of components. The packaging of components requires extensive machining of the package to provide isolation between components. This results in increased labor and material expense.

As one can appreciate, in the known system, a solid block of shielding material is machined to create cavities in which microwave components are disposed. Such methods also require electrical tuning of the resulting devices to avoid interference between components. As the properties of each package and configuration differ, the RF properties of high frequency devices in such environments differ as well. Consequently tuning is required in such environments to obtain optimal results, increasing labor and difficult of manufacture.

Low temperature co-fired ceramic processes are known multi-layer construction techniques, allowing for the integration of electrical components in a multi layer structure. In spite of the advantages that have been identified in these other applications, LTCC has not been utilized in the integration of microwave and other RF devices in the manner contemplated by the present invention.

What is needed therefore is a technique for applying low-temperature co-fired ceramic processes to the construction of high frequency and microwave transmit/receive devices.

SUMMARY OF THE INVENTION

One embodiment of the present invention provides a system for the integration of microwave components in a Low Temperature co-fired ceramic, the system comprising: a low temperature co-fired ceramic body having a top surface, into which is disposed a plurality of cavities; a plurality of microwave devices, each the device being disposed within a cavity from the plurality of cavities such that the cavities provide radio isolation to the devices; and a Coaxial connection disposed within the body configured to connect the devices to external components the coaxial components comprising vias disposed within the co-fired ceramic body.

Another embodiment of the present invention provides such a system further comprising a bump bond array disposed on a side of the body opposed to a side of the body upon which the coaxial connection is disposed.

A further embodiment of the present invention provides such a system wherein the cavities are formed prior to the firing of the body.

Yet another embodiment of the present invention provides such a system further comprising at least one via disposed within the body connecting a first cavity within the plurality of cavities, and a second the cavity in the plurality of cavities.

A yet further embodiment of the present invention provides such a system wherein the microwave device is dispose completely within the cavity.

Still another embodiment of the present invention provides such a system wherein the coaxial connection comprised a male coaxial coupler, extending from a first surface of the body, and a plurality of conductive vias disposed within the device forming a substantially coaxial configuration.

A still further embodiment of the present invention provides such a system wherein the vias are configured to maintain their coaxial configuration while making a right angle bend so as to be disposed parallel with the first surface.

Even another embodiment of the present invention provides such a system wherein at least one the device is a monolithic integrated microwave circuit.

An even further embodiment of the present invention provides such a system wherein the body comprises 12 layers of Low-temperature co-fired ceramic.

One embodiment of the present invention provides a passive integrated circuit for integration with at least one active circuit; the passive integrated circuit medium comprising: a plurality of layers of low temperature co-fired ceramic; a plurality of recesses disposed within the co-fired ceramic and configured to receive the at least one active circuit and isolate the active circuit from radio frequency interference; conductive connections disposed between recesses of the plurality of recesses, whereby the active circuits are integrated.

Another embodiment of the present invention provides such a circuit wherein the active circuit comprises a microwave device.

A further embodiment of the present invention provides such a circuit wherein the microwave device is a monolithic integrated microwave device.

Still another embodiment of the present invention provides such a circuit further comprising a coaxial connection.

A still further embodiment of the present invention provides such a circuit wherein the coaxial connection comprises: a plurality of vias disposed perpendicularly through several layers of the plurality of layers of low temperature co-fired ceramic and in an annular pattern around a ventral via; a layer of conductive material within a layer of the low temperature co-fired ceramic the layer of conductive material having a partially annular end with an interruption, the annular end being disposed around the central via and coupled both to the plurality of vias and first and second extended connectors coupled to opposing sides of the interruption; a center via contact extending from the center via and between the first and second extended connectors.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
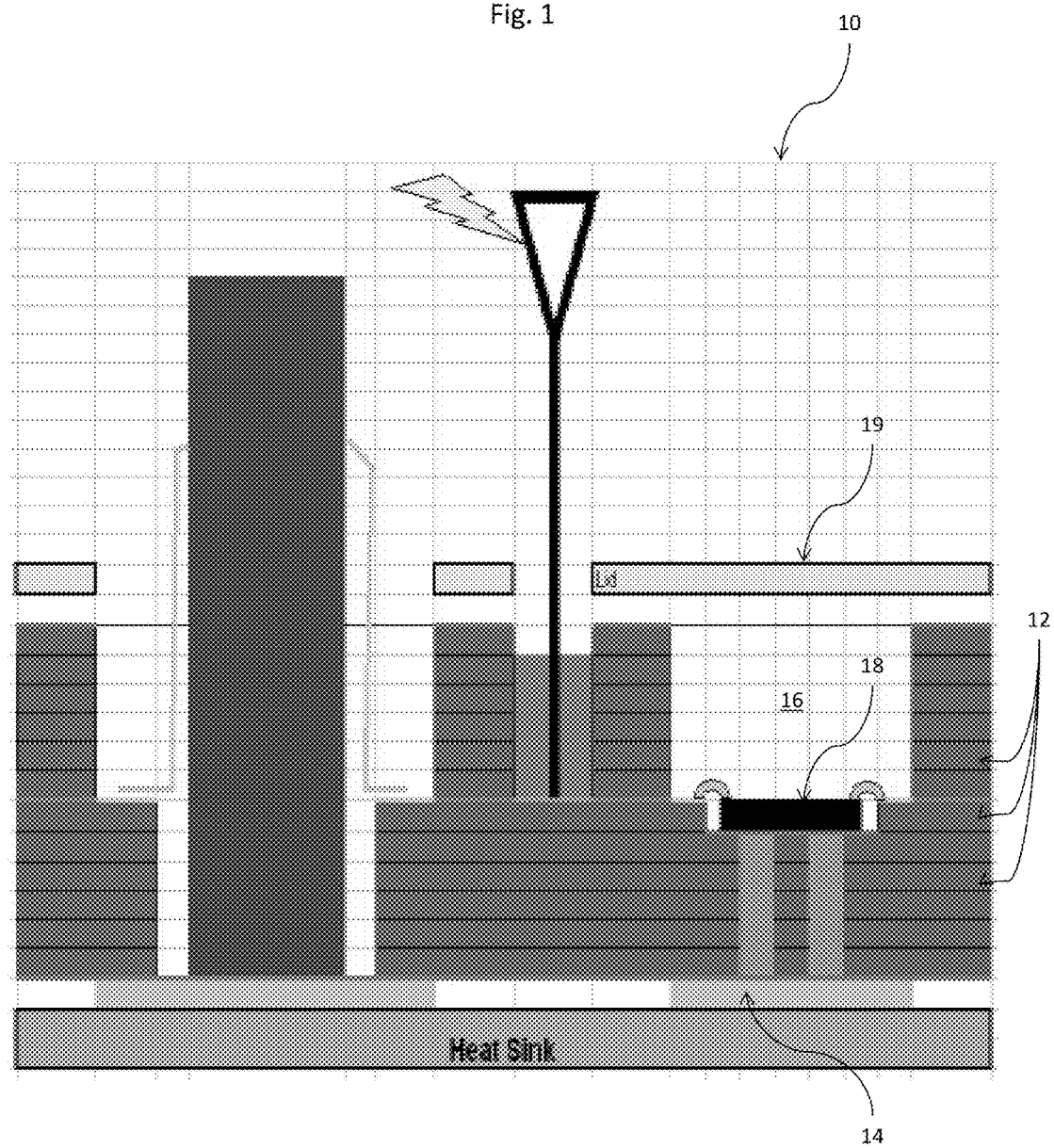
FIG. 1 is a block diagram illustrating an elevation view of a low temperature co-fired ceramic transmit/receive (t/r) assembly configured in accordance with one embodiment of the present invention.
Figure 2:
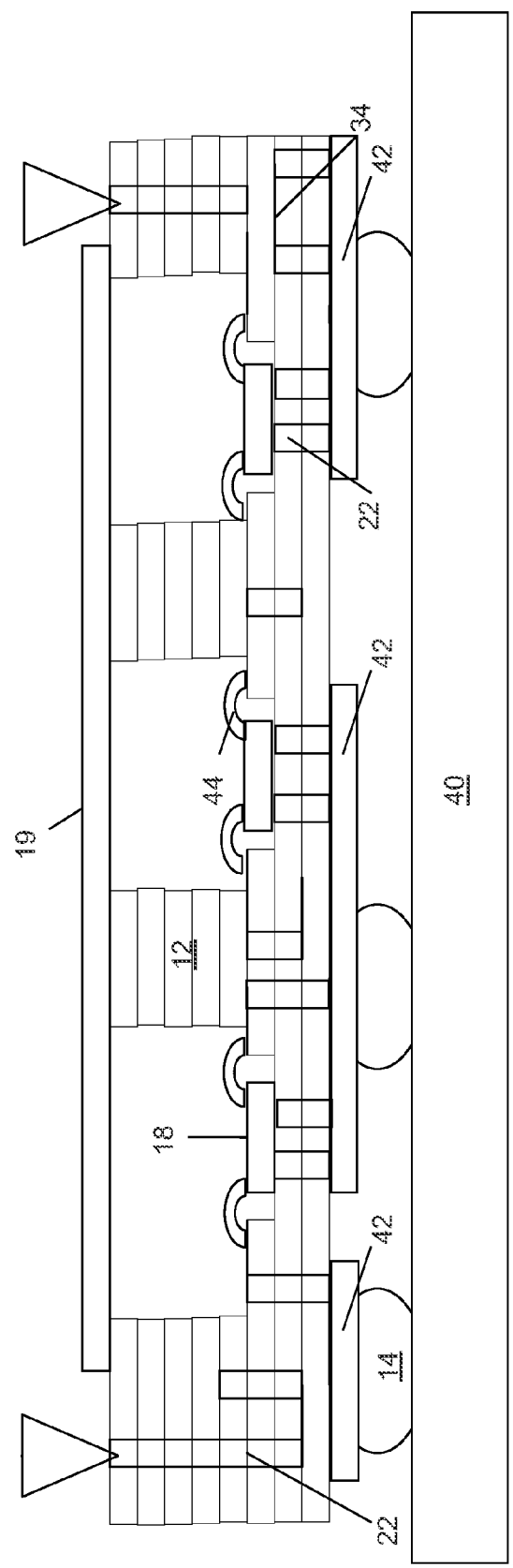
FIG. 2 is a block diagram illustrating an elevation view of a low temperature co-fired ceramic transmit/receive (t/r) assembly configured in accordance with another embodiment of the present invention.

Low Temperature Co-fired Ceramic (LTCC) transmit/receive microwave system 10 configured according to one embodiment are provided with multiple layers 12, in one embodiment, 12 layers laminated and fired. An example of such system is illustrated in FIGS. 1 and 2. One skilled in the art will appreciate that other numbers of layers may be employed to achieve desired structures and cavity depths. In the embodiment illustrated in FIG. 2, a system configures according to one embodiment of the present invention is disposed on an interconnection substrate 40 and is coupled to that substrate 40 by means of a ball grid connection 14 coupled to plurality of solder connection pads 42. The pads 42 connect to thermal vias 22 connected to integrated circuits 18 connected by integrated circuit connectors 44 which are connected to internal LTCC connectors 34 and LTCC vias 22. The system may be configured with antenna elements 20 and hermetically sealed 19.

Figure 3:
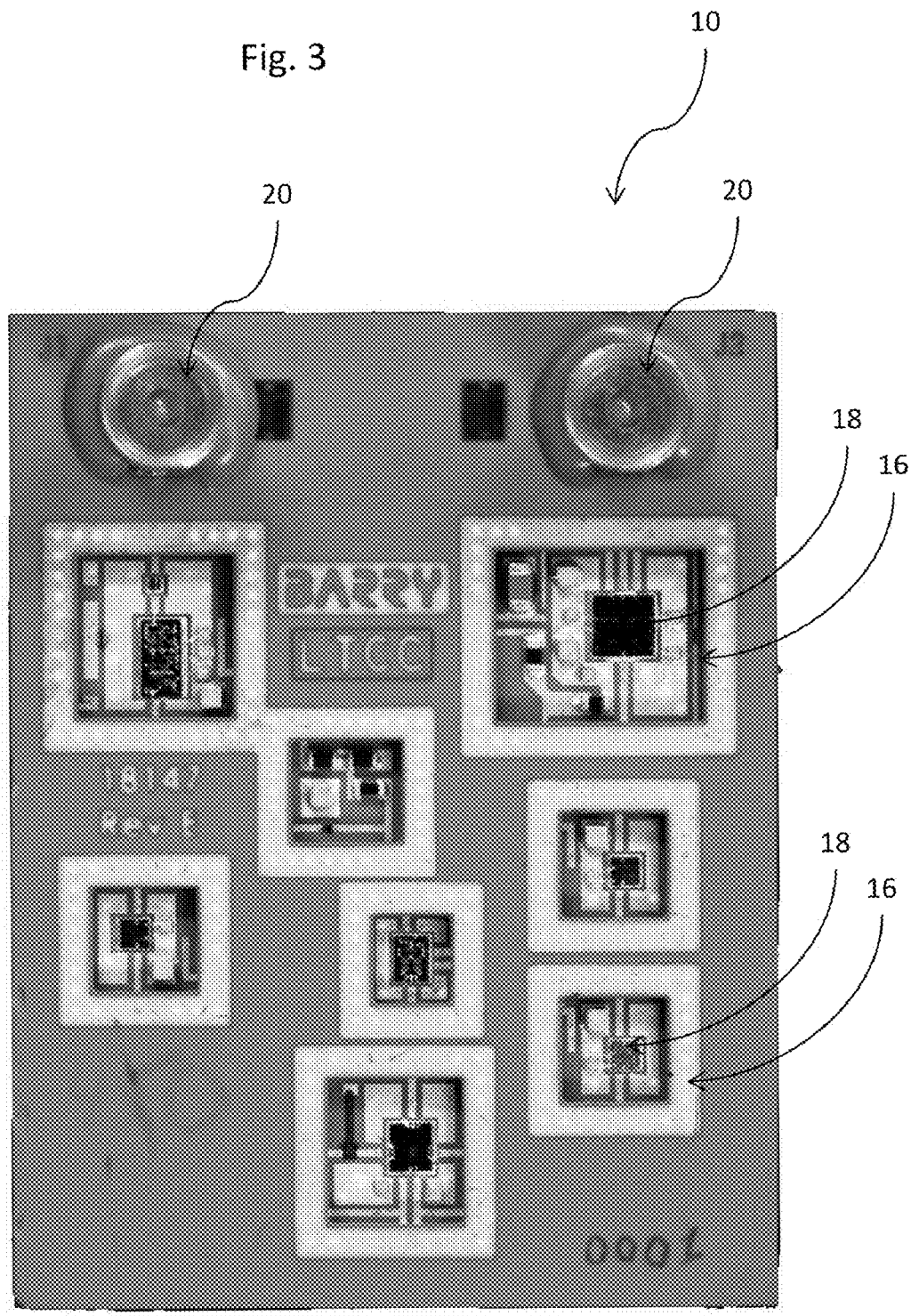
FIG. 3 is a photograph illustrating an plan view of a low temperature co-fired ceramic transmit/receive (t/r) assembly configured in accordance with one embodiment of the present invention.

The LTCC structures configured according to one embodiment of the present invention form a passive circuitry medium which accommodates active circuits such as monolithic microwave integrated circuits (MMICs). The LTCC structure configured in one embodiment of the present invention provide integration of electrical, optical and RF components while maintaining shielding between those components. The configuration likewise provides for close packaging of elements and stacking of boards. As illustrated in FIGS. 2 and 3, one embodiment of the present invention provides cavities 16 wherein are disposed microwave components 18. The components 18 are disposed within the cavities 16 which provide shielding for the devices 18 and allow for the enclosure of the devices within the integrated transmit and receive circuits 10. In some embodiments, a cap or cover 19 may be provided. This in turn allows for smaller packaging and closer integration of microwave circuits.

Figure 5:
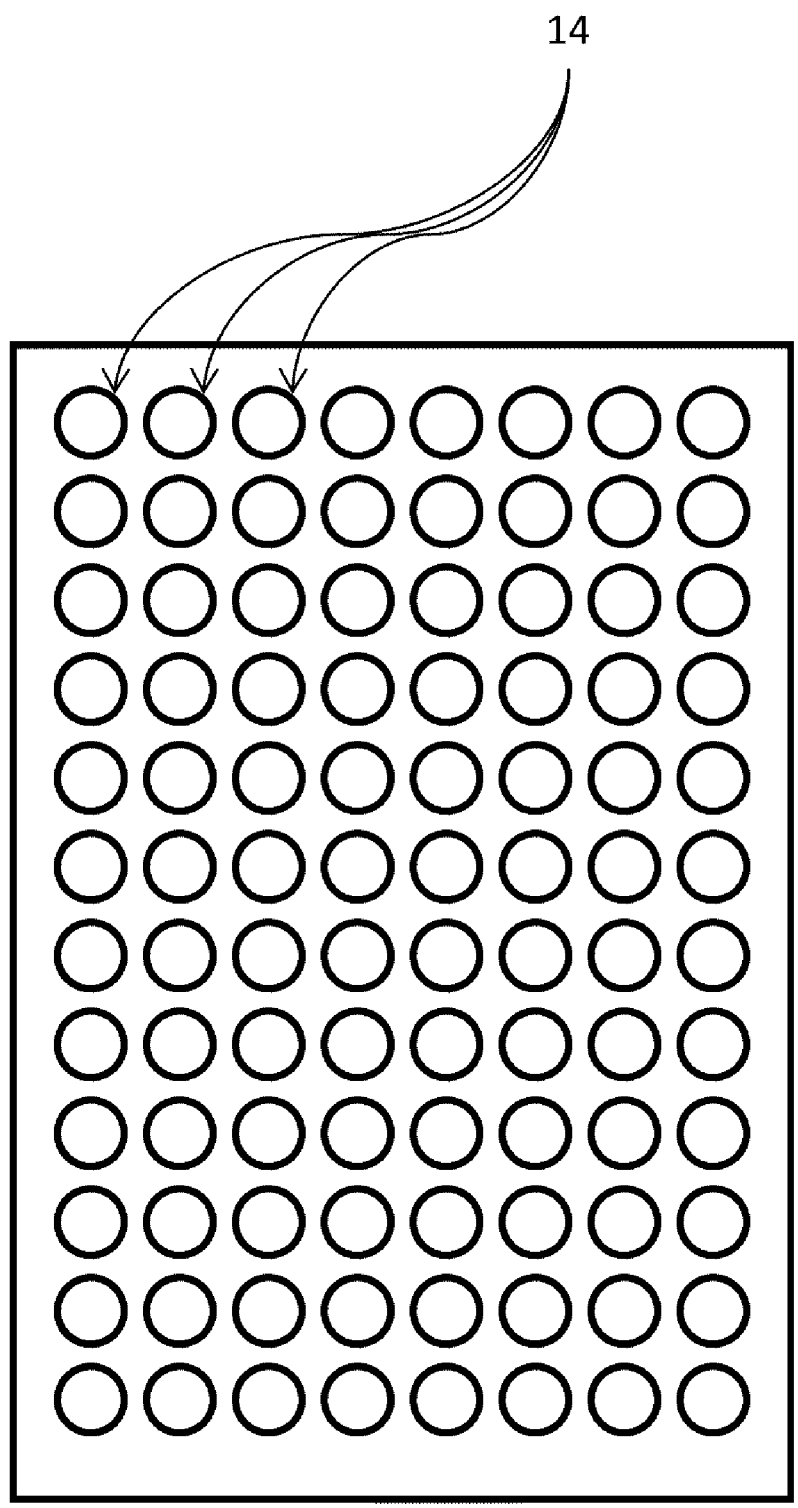
FIG. 5 is a block diagram illustrating a plan view of a ball grid array of allow temperature co-fired ceramic transmit/receive (t/r) assembly configured in accordance with one embodiment of the present invention.

In one such embodiment, contacts 14 are disposed on a backside of the structure, conveying microwave signals, voltage and grounds, and are formed and processed into a ball grid array 14 illustrated in FIG. 5. These circuits are attached to single or multilayered Teflon based organic circuit boards (not shown) to form a complete RF/Microwave front-end circuit for receiver and transmitter (R/T) applications employed in systems such as Radar, Tag, and Electronic Warfare Systems. The balls are connected to the conductive mating interconnect pattern using solder or conductive epoxy.

Figure 4:
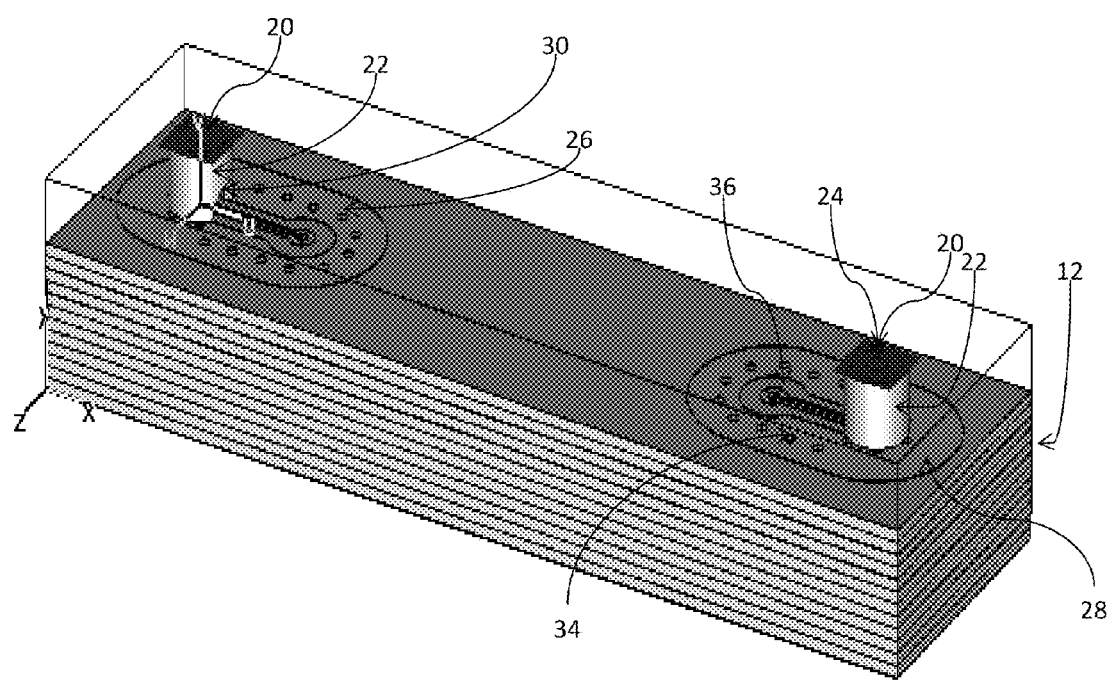
FIG. 4 is a perspective view of coaxial connector from a low temperature co-fired ceramic transmit/receive (t/r) assembly configured in accordance with one embodiment of the present invention.

As illustrated in FIG. 4, a plurality of coaxial connections are made in the top of the device for shielded connection to external sources, these coaxial connections allow the microwave devices on the co-fired device to be connected to systems and devices external to the chip, without interference that might be present with unshielded connections. In one embodiment, that coaxial connection 20 comprises a plurality of vias 22 disposed perpendicularly through several layers low temperature co-fired ceramic 12 and disposed in an annular pattern around a central via 24. A layer of conductive material 26 is embedded within the low temperature co-fired ceramic. The layer of conductive material 26 is provided with a partially annular end 28 with an interruption 30, that annular end 28 being disposed around the central via 32 and coupled both to the plurality of vias 22 and to extended connectors 34 coupled to opposing sides of the interruption 30. A center via contact 36 is provided extending from the center via 30 and between the extended connectors 34. In an alternative embodiment, the coaxial configuration is maintained within the co-fired ceramic material by means of vias within the material that are configured in a coaxial manner. These coaxial connectors, may in some embodiments be configured to transition into an array of bump bonding contacts disposed on the bottom side of the co-fired ceramic body. Alternatively other connector configurations may be provided in addition to bump-bond technology.

In one embodiment of the present invention, a plurality of cavities 16 is disposed within an LTCC structure. These cavities 18, are formed in the co-fired ceramic prior to firing, and are prepared to receive the microwave and other devices 18. The cavities are aligned with various vias and connectors disposed within the co-fired ceramic 10 such that said deices are aligned with the integrated connectors.

In one embodiment, device antennas may be configured to extend outside of the cavity, so as to avoid shielding of the ceramic body. In contrast, devices having The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A system for the integration of microwave components in a low temperature co-fired ceramic, the system comprising:
  a low temperature co-fired ceramic body having a top surface, into which is disposed a plurality of cavities;
  a plurality of microwave devices, each said device being disposed within a cavity from said plurality of cavities such that said cavities provide radio isolation to said devices; and
  a coaxial connection disposed within said body configured to connect said devices to external components said coaxial components comprising vias disposed within said co-fired ceramic body, said coaxial connection comprising a male coaxial coupler, extending from a first surface of said body, and a plurality of conductive vias disposed within said device forming a substantially coaxial configuration.

2. The system of claim 1 further comprising a bump bond array disposed on a side of said body opposed to a side of said body upon which said coaxial connection is disposed.

3. The system according to claim 1 wherein said cavities are formed prior to the firing of said body.

4. The system according to claim 1 further comprising at least one via disposed within said body connecting a first cavity within said plurality of cavities, and a second cavity in said plurality of cavities.

5. The system according to claim 1 wherein said microwave device is disposed completely within said cavity.

6. The system according to claim 1 wherein said vias are configured to maintain their coaxial configuration while making a right angle bend so as to be disposed parallel with said first surface.

7. The system according to claim 1 wherein at least one said device is a monolithic integrated microwave circuit.

8. The system according to claim 1 wherein said body comprises 12 layers of Low-temperature co-fired ceramic.

9. A passive integrated circuit for integration with at least one active circuit; said passive integrated circuit medium comprising:

a plurality of layers of low temperature co-fired ceramic;
  a plurality of recesses disposed within said co-fired ceramic and configured to receive said at least one active circuit and isolate said active circuit from radio frequency interference;
  conductive connections disposed between recesses of said plurality of recesses, whereby said active circuits are integrated
  a coaxial connection comprising a plurality of vias disposed perpendicularly through several layers of said plurality of layers of low temperature co-fired ceramic and in an annular pattern around a ventral via; a layer of conductive material within a layer of said low temperature co-fired ceramic said layer of conductive material having a partially annular end with an interruption, said annular end being disposed around said central via and coupled both to said plurality of vias and first and second extended connectors coupled to opposing sides of said interruption; and a center via contact extending from said center via and between said first and second extended connectors.

10. The passive integrated circuit according to claim 9, wherein said active circuit comprises a microwave device.

11. The passive integrated circuit according to claim 10 wherein said microwave device is a monolithic integrated microwave device.

* * * * *